United States Patent [19]

Desautels

[11] Patent Number: 4,975,636

[45] Date of Patent: Dec. 4, 1990

[54] METHOD AND APPARATUS FOR SELECTING AND DISPLAYING A HIGH RESOLUTION WINDOW FROM A MAIN DISPLAY

[75] Inventor: Patricia A. Desautels, Colorado Springs, Colo.

[73] Assignee: Hewlett-Packard Company, Palo Alto, Calif.

[21] Appl. No.: 345,903

[22] Filed: May 1, 1989

[51] Int. Cl.⁵ .................. G01R 13/20; H01J 29/70
[52] U.S. Cl. ...................... 324/121 R; 340/728; 364/487
[58] Field of Search .......... 324/121 R, 77 R; 340/723, 728; 364/487

[56] References Cited

U.S. PATENT DOCUMENTS

| | | | |
|---|---|---|---|
| 4,072,851 | 2/1978 | Rose | 364/487 |
| 4,555,765 | 11/1985 | Crooke et al. | 364/487 |
| 4,593,242 | 6/1986 | Bristol et al. | 324/121 R |
| 4,704,691 | 11/1987 | Blair | 324/121 R |

Primary Examiner—Ernest F. Karlsen
Attorney, Agent, or Firm—Karl E. Bring

[57] ABSTRACT

A windowed portion of a displayed waveform under test, typically from an oscilloscope display, is simultaneously displayed at a higher resolution by using a software program in conjunction with the existing timebase circuit rather than using a second timebase circuit. The software uses the resolution of the interpolators (a stretcher circuit which uses capacitors to hold acquire a charge and measure the amount of time necessary to slowly discharge the circuit) to carry through all the plotting of points to a first and second display.

2 Claims, 12 Drawing Sheets

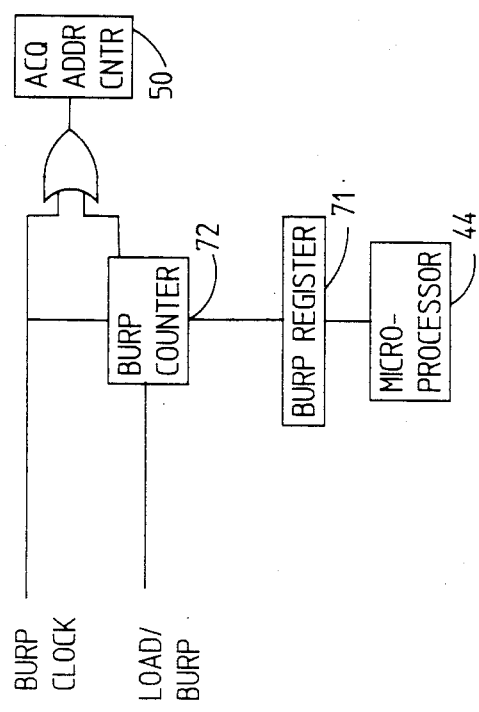
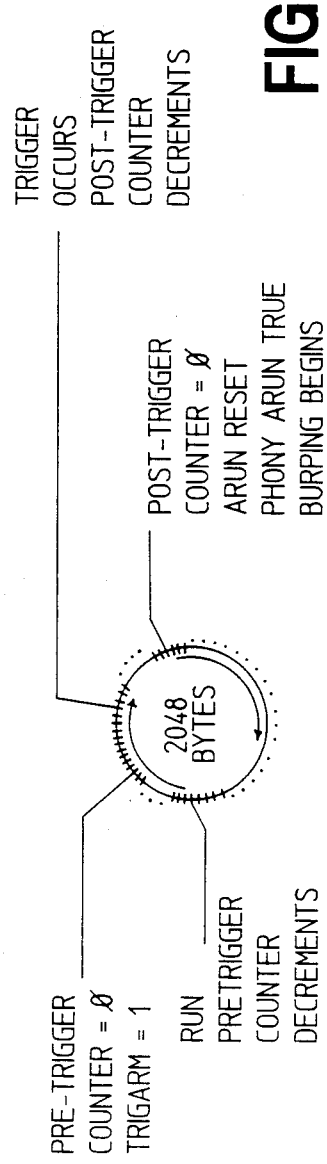
FIG 11A
FIG 11B

METHOD AND APPARATUS FOR SELECTING AND DISPLAYING A HIGH RESOLUTION WINDOW FROM A MAIN DISPLAY

BACKGROUND OF THE INVENTION

This invention relates to digital oscilloscopes and more particularly to the display of waveforms acquired from a system under test.

Digital oscilloscopes are used in the art to acquire and display waveforms from a system under test. Single-shot oscilloscopes are used to examine nonrepetitive waveforms, while repetitive sampling oscilloscopes are used to examine repetitive waveforms from a system under test. Repetitive sampling oscilloscopes make several separate acquisitions of data which are combined to provide the user with a complete picture of the waveform at a chosen resolution.

One method of acquiring data consists of continuous sampling of the waveform under test, transforming the analog signals to digital signals, then storing the digital results in a defined circular memory. Once a user-defined trigger event occurs, samples continue to be acquired until the number is sufficient for display purposes, then the continuous sampling is halted. Hardware interpolators in a timebase circuit determine the time relationship between the trigger event and the acquired samples, and the acquired samples (one acquisition) are displayed relative to the trigger event. FIG. 1A shows a waveform under test. FIG. 1B shows a timing diagram for a sample clock. A trigger level is chosen by the user for the waveform under test as shown in FIG. 1A, a trigger event occurs in FIG. 1A, and is indicated in FIG. 1C. Assuming samples of the waveform under test are acquired at each rising edge of the sample clock, the acquired samples would be displayed by a digitizing oscilloscope as shown in FIG. 1D. The continuous sampling is resumed until the trigger event occurs again, and the process is repeated to obtain a second acquisition, which is also displayed. FIG. 2A shows the oscilloscope display of a waveform under test after one acquisition, while FIG. 2B shows the same display after two acquisitions. This process is repeated continuously, and the accumulation of acquisitions is displayed by the oscilloscope, as shown in FIG. 2C.

The display of a digital oscilloscope is usually a raster display which consists of rows (x-axis) and columns (y-axis) of discrete pixels. The accumulation of acquisitions are mapped onto the display, with time of the sample placed on the x-axis and the value of the sample on the y-axis. The user chooses the length of time to be displayed from a range of predetermined choices, and thereof determines the period of time each column represents. Only one sample value is represented in each column, so the occurrence of a new sample value during an acquisition in a particular column having an existing value causes the existing value to be erased and the new sample value displayed. Consequently, the resolution of the oscilloscope is limited to the particular time length chosen by the user. The maximum resolution of the oscilloscope is controlled by the maximum resolution of the hardware interpolators, assuming the interpolators have a higher resolution than the sample clock.

Often a user finds it advantageous to choose a time length which displays a relatively large period of time, thus permitting the user to observe the primary characteristics of the waveform. After observing the waveform at this resolution, the user often desires to observe a portion of the displayed waveform at a higher resolution, and make measurements of the waveform which are more accurate because of the higher resolution of the display. One example of a measurement is the 10-90% rise time. FIG. 3A shows a relatively low resolution display of a waveform under test. Because of the limited number of points which can be displayed on the rising edge, the 10-90% risetime measurement is not very accurate. FIG. 3B shows a higher resolution display (relative to FIG. 3A) of the same waveform. Measurements made on the waveform under test (based on the displayed points) will be more accurate, because the higher resolution of the display allows more rising edge points to be displayed.

In the prior art, two solutions are available. In an oscilloscope having a single timebase circuit for displaying a waveform, the oscilloscope must be reconfigured for a higher resolution by choosing a different time length from the predetermined choices, and then choosing the particular time period which the user desires to examine by adjusting the trigger event or reference to the trigger event. The disadvantages of this solution are that it is inconvenient to accomplish and may be very difficult to define a trigger event which enables the user to view the time of interest. Also, the user is prevented from any kind of simultaneous observation of primary and secondary characteristics of waveform, and the viewed waveforms will not be based on the same data, even though the waveform is repetitive.

In the second prior art solution, the oscilloscope has a second timebase circuit which is set to a separate resolution and a separate trigger event, therefore providing a separate accumulation of points which may be observed by the user on a separate display, or shared on the first display. This allows the user to observe both the primary and secondary characteristics of the waveform, and provides a higher resolution waveform for measurement purposes, consequently allowing more accurate measurements. The disadvantages of this solution are the requirement of additional hardware which requires both physical space within the oscilloscope, thereby limiting the available space for other hardware, and additional cost, which makes the oscilloscope more expensive to the user. It is typical within a digitizing oscilloscope to place the analog-to-digital converters, the trigger circuitry, timebase circuits, and acquisition memory on a single circuit board. Additional hardware and associated connections increase the possibility for unwanted noise and signal distortion. Less hardware gives the oscilloscope designer more choices in hardware placement, therefore reducing the possibility of noise on a particular board.

SUMMARY OF THE INVENTION

In accordance with the illustrated preferred embodiment of the present invention, a software program in conjunction with timebase hardware permits a user to display a waveform under test at a first user-determined resolution, and to concurrently select and display a subsection of the displayed waveform on a second display at a second user-determined resolution higher than the first resolution, without requiring additional timebase hardware. FIG. 4 shows a block diagram of an apparatus according to the present invention. FIG. 5 shows a flowchart of a method according to the present invention.

Under the control of the software program at block 52, a waveform under test is continuously sampled by a sample-and-hold circuit 41, the sampled values are converted from analog to digital values by an analog-to-digital converter 42, and are stored in a circular memory 43. The sampling halts at a point relative to the user-defined trigger event, and user-defined points of interest relative to the trigger event are stored in the circular memory 43. The time interval between the trigger event and next sample clock (SCLK) pulse is measured by a hardware interpolator circuit (using a capacitor stretcher circuit) contained within the timebase circuit 51.

The sample period residual time is calculated by subtracting all undivided sample periods from the time at the left edge of a display. This residual time represents the correction required because the left screen edge time is probably not equal to an integer number of SCLK periods.

The interpolator time, the time between the trigger event and the next SCLK pulse, is measured by the interpolator hardware. The interpolator time represents the correction required because the trigger event will probably not occur simultaneously with a SCLK pulse.

The residual time is subtracted from the interpolator time to find the correct time value for sample point placement. The sample point placement value is converted from time to columns by dividing the value by the time per display column, which was defined by the user when choosing a particular length of time to be displayed. This converted value provides a high resolution column index for placing display points on the x-axis of a display. The correct column for display is provided by truncating the value of the high resolution column index.

The SCLK period is used to determine the number of display columns between samples, or high resolution column increment. Once the column for the first sample is established from a truncated value of the high resolution column index, and the first acquired value from the circular memory 43 is plotted to that column at block 54, the high resolution column index is incremented by the high resolution column increment at block 58 for each succeeding point and the points are plotted accordingly. Each succeeding column for display is provided by truncating the value of the high resolution column index. By maintaining the high resolution in the column index and the column increment, and using truncation to determine the appropriate column, the high resolution is available for use with a second display.

As each point is plotted to the main display 46, it is tested at block 55 to determine if it lies within a subsection of the displayed waveform defined by the user. The columns for points which lie with the user-defined subsection are also determined from the high resolution column index. The column value of the left edge of the second display is subtracted from the high resolution column index and the result is multiplied by an expansion factor to obtain a second display column value. The expansion factor is defined to be the displayed time in the first display divided by the displayed time in the user-defined subsection. The second display column value is truncated to produce the correct column on the second display for plotting the current point. By carrying the additional resolution with the high resolution column index through to the second display column value, the greater resolution is available for plotting points on a second display at block 57.

Alternately, a second display column index and second display column increment could be used to implement the present invention.

Once a full acquisition has been plotted, the user has the option at block 60 to obtain additional sets of points to fill in the waveform as shown in FIG. 2.

FIG. 6 shows an example of a screen display according to the present invention. The user has chosen the timebase to be 100 ns/division. The delay for centering the trigger event is 0.0 seconds. The reference for the curser controls is CENTER. The second display (or window) is ON. The timebase for the window display is 5.00 ns/division, and the position is at 0.0 seconds. The risetime is measured from the second display and is shown to be less than or equal to 3.393 ns. The second display shows from −25 ns to 25 ns in time.

The first display allows only a few points to be plotted at the rising edge of the pule because of the limitation of one plotted point per column. The second display allows the user greater resolution and improved accuracy in measurements while maintaining the first display. FIG. 6 shows both first and second displays at separate resolutions while being shown on the same display unit.

FIG. 12 shows an example of a display according to the preferred embodiment of the present invention. The waveform under test is a multiburst, a Vertical Interval Test Signal (VITS) showing frequency-gain characteristics, which is also used for monitoring setups and frequency selective compression.

The present invention allows the user to more easily and more accurately observe the secondary characteristics of the waveform under test simultaneous with observation of the primary characteristics without the additional monetary and signal integrity cost of a second timebase implemented in hardware. Additionally, the user may observe two displays at different resolutions, but which are derived from the same data.

The resulting window display could be shown on a separate display or as a part of a shared single display, for example, display 46 shown in FIG. 4.

BRIEF DESCRIPTION OF THE DRAWINGS

FIGS. 11A and 11B show a logic circuit diagram of a burp counter and representation of the acquisition cycle for the circular memory according to the preferred embodiment of the present invention.

DETAILED DESCRIPTION OF THE PREFERRED EMBOBIMENT

Figure 1:
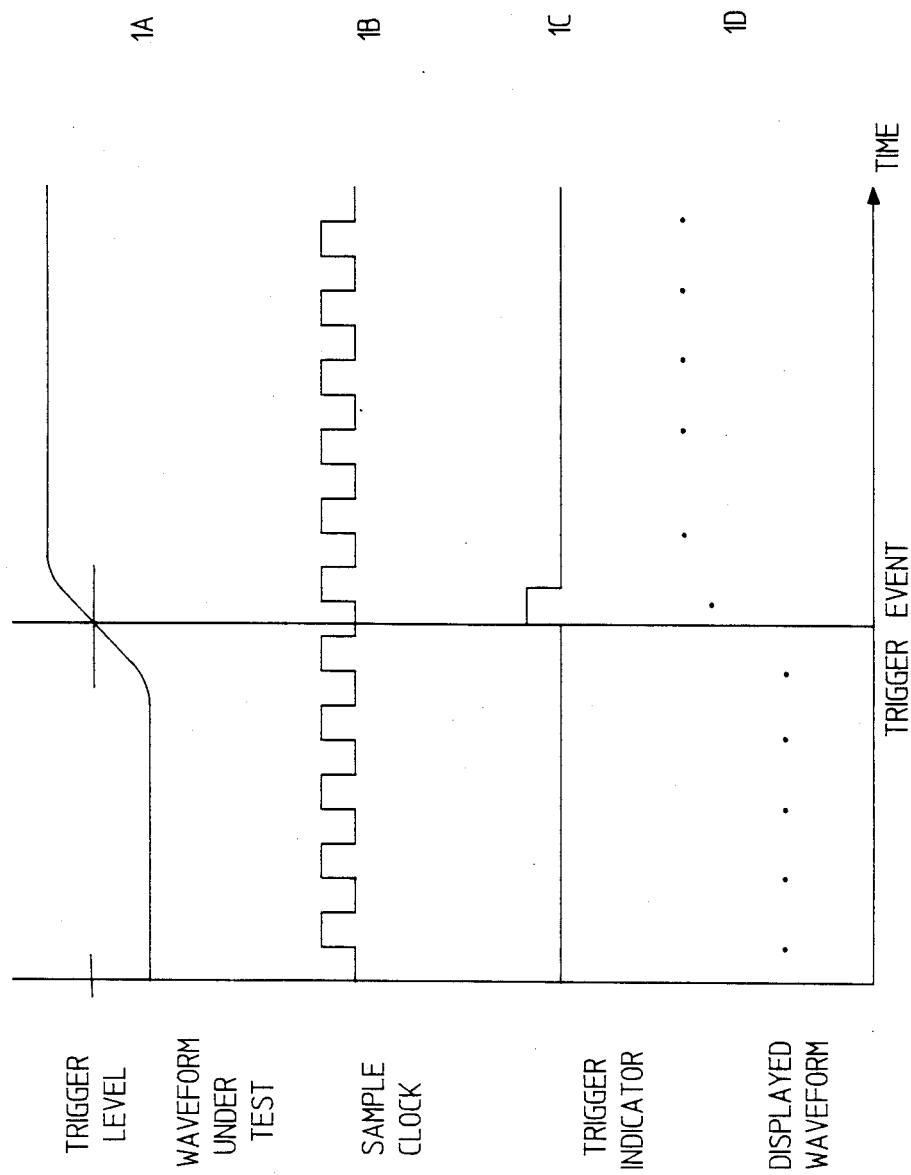
FIG. 1 is a timing diagram showing an example of digital acquisition in the prior art.
Figure 2A:
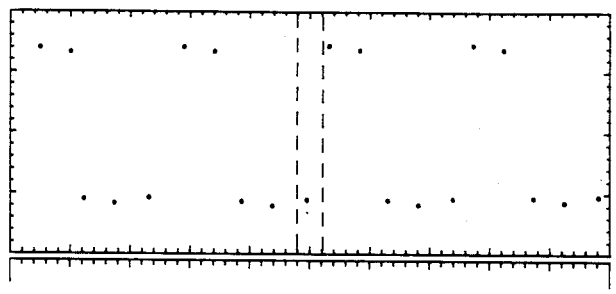
FIGS. 2A, 2B, and 2C show a displayed signal from a repetitive sampling oscilloscope after one acquisition, two acquisitions, and several acquisitions respectively.
Figure 2B:
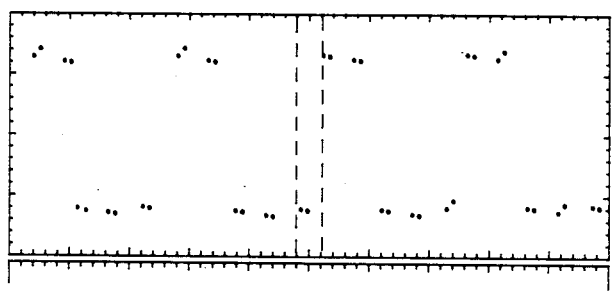
Figure 2C:
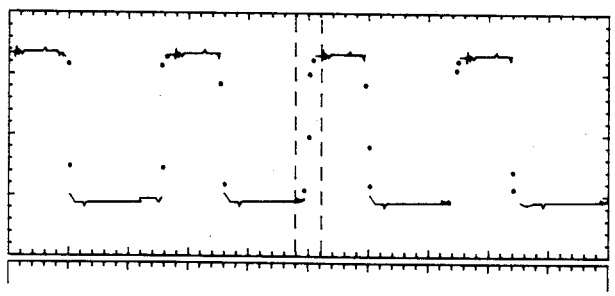
Figure 3A:
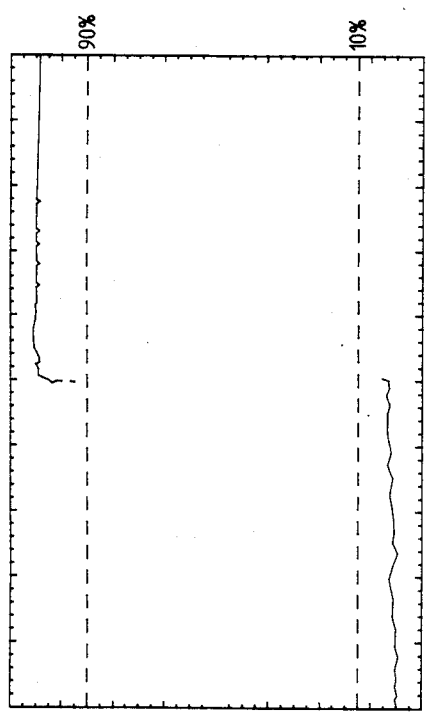
FIGS. 3A and 3B show a signal under test displayed at a low resolution and a high resolution respectively.
Figure 3B:
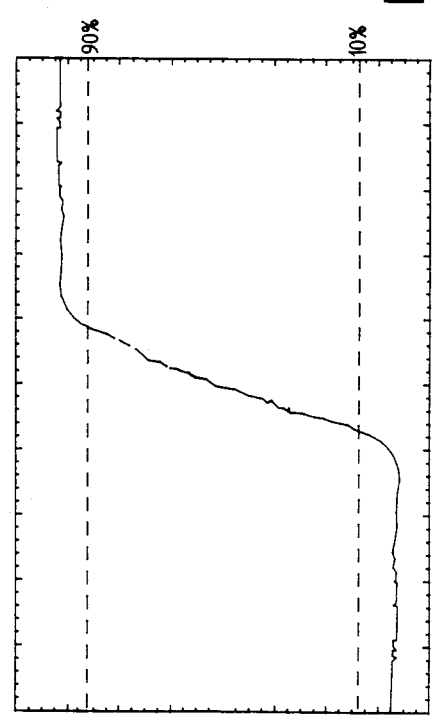
Figure 4:
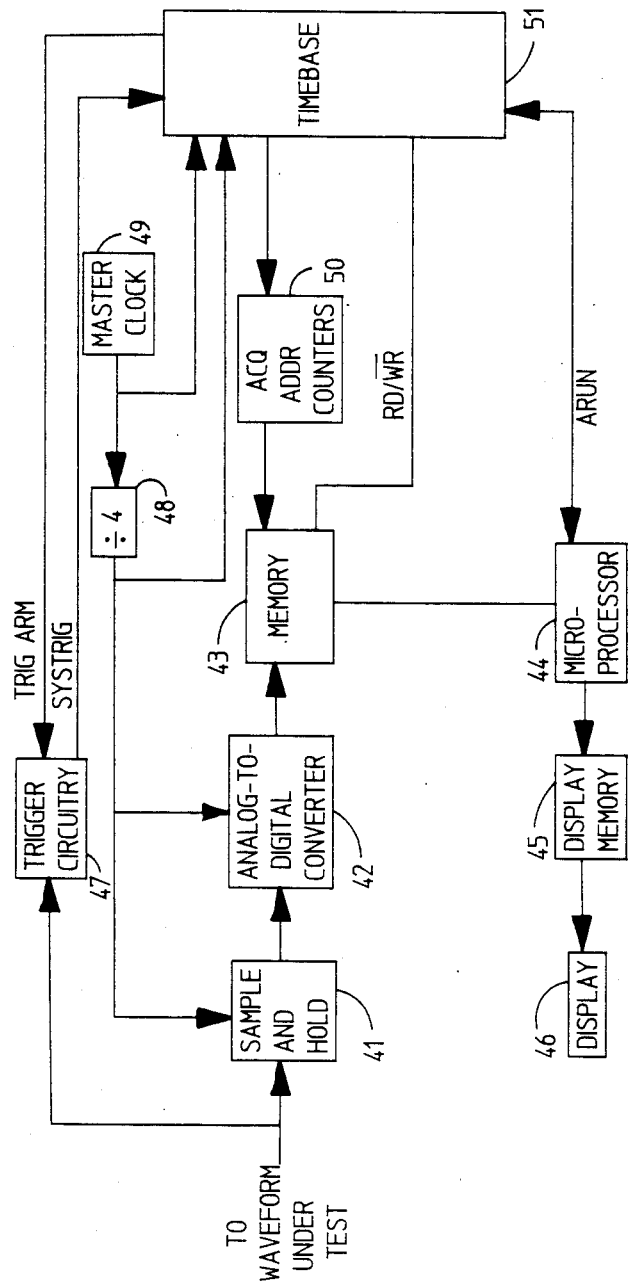
FIG. 4 is a block diagram of the oscilloscope according to the preferred embodiment of the present invention.

FIG. 4 shows a block diagram of an oscilloscope according to the preferred embodiment of the present invention. During an acquisition of points as in block 52 of FIG. 5, a sample-and-hold circuit 41 samples the waveform under test and holds the sampled analog value such that an analog-to-digital (A/D) converter 42 may convert the acquired samples into digital values, which are then stored within a circular memory 43. The location at which values are stored within memory 43 is controlled by an acquisition address counter 50 which is clocked by the timebase 51. During sampling the counter 50 is clocked by the SCLK.

Circuit 41 and converter 42 operate in response to an SCLK, which is created from a master clock (MCLK) 49, operating in one embodiment at approximately 81.7 MHz, and a divide-by-four circuit 48, to provide an SCLK rate of approximately 20.4 MHz, and an SCLK period of 49.0 ns.

MCLK and SCLK are also provided to the timebase 51. Timebase circuits are well known in the art, and may be implemented in a variety of ways. The timebase circuitry is responsible for controlling data acquisition, time reference, measuring the time between a trigger event and the next SCLK pulse through the use of interpolators, controlling MCLK (used by the interpolators) and SCLK, and pretrigger and post-trigger delay times.

The timebase circuit has a series of 8-bit registers. These registers are loaded during initialization and include:

(a) decade dividers of SCLK;
(b) control registers used to choose channels for sampling, and maintain control of various lines (read-/write line for memory 43, load/burp line for controlling a burp counter for counter 50, Phony ARUN line for mimicking an acquisition while advancing (burping) the counter 50 to a valid acquisition point after an acquisition, run/stop line for obtaining an acquisition);
(c) counter registers (pretrigger delay counter holds number representing user-defined number of samples to be acquired prior to arming trigger circuitry 47, post-trigger delay counter holds number representing user-defined number of samples to be acquired before stopping the acquisition after trigger circuitry 47 detects a user-defined trigger event, burp register holds number representing the number of single steps the counter 50 must make to point at the first valid pretrigger sample)
(d) interpolator counters (coarse interpolator counter counts the number of MCLK pulses from a trigger event to a first SCLK pulse, fine interpolator counter counts the number of MCLK pulses occurring during the stretch cycle of the capacitor stretch circuit).

Figure 5:
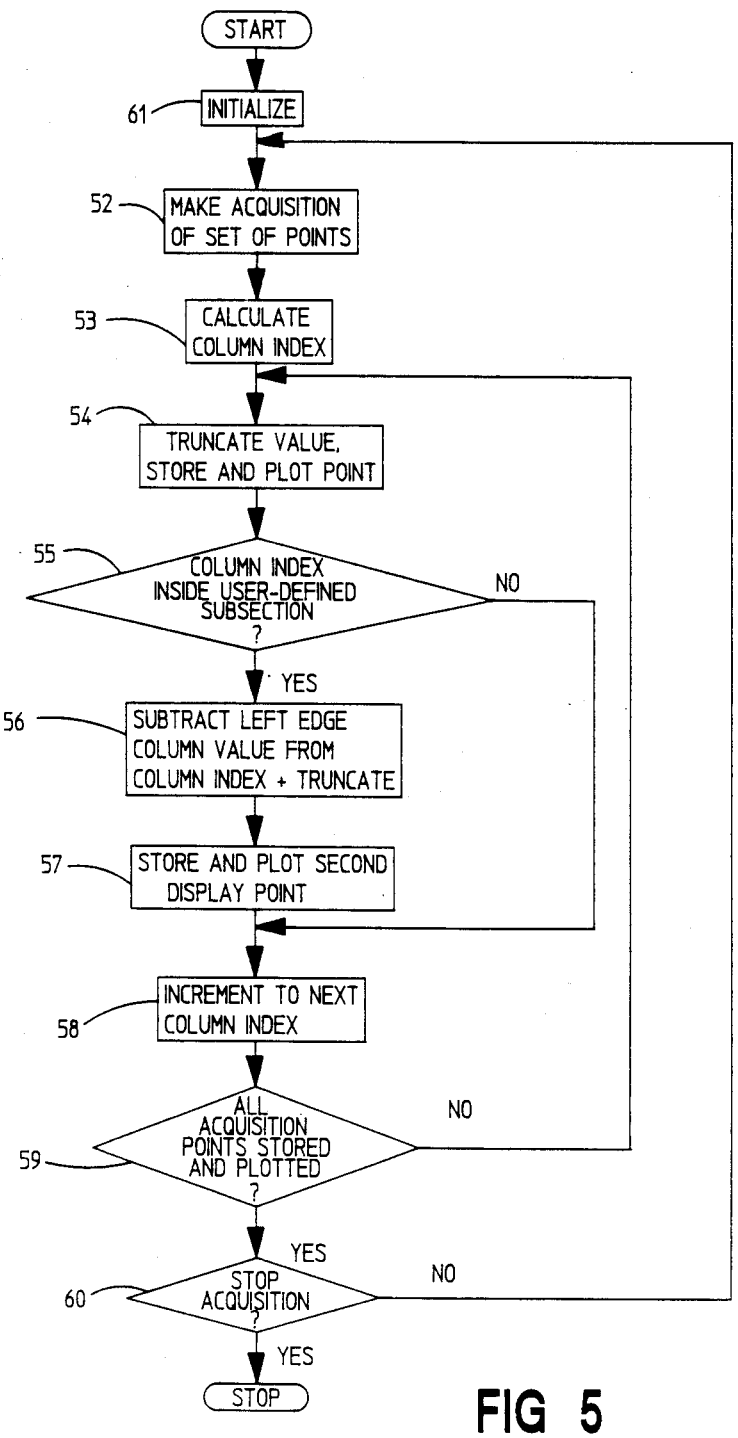
FIG. 5 is a flowchart of a method used in the preferred embodiment of the present invention.
Figure 6:
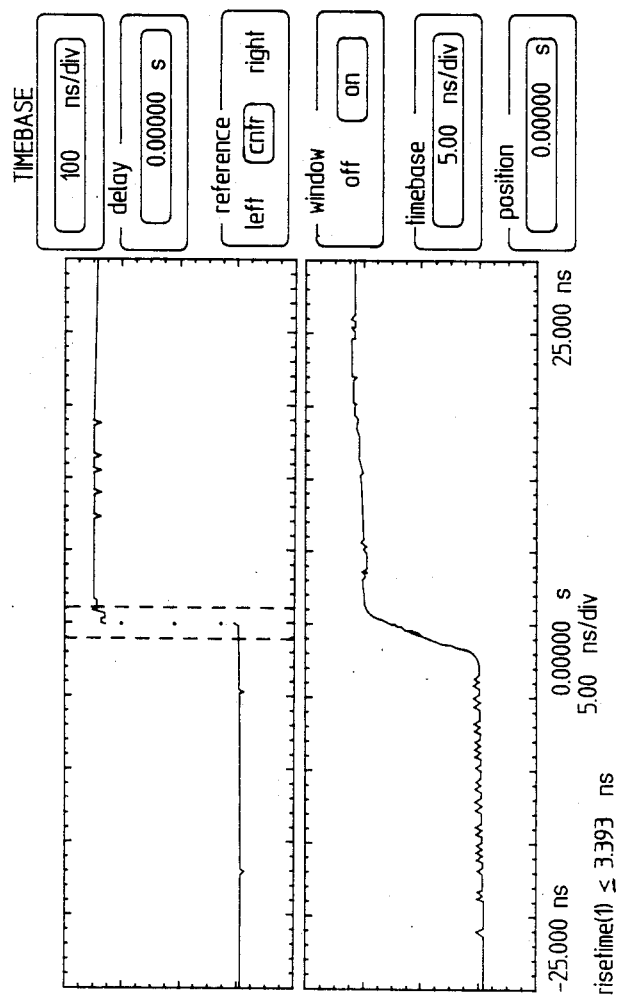
FIG. 6 shows a display of a waveform under test in a combined normal and window display.

The timebase 51 responds to the microprocessor 44 via the ARUN line and begins an acquisition as in block 52 of FIG. 5. The pretrigger delay counter decrements for each sample acquired and stored in memory 43. When the pretrigger counter reaches zero, the timebase 51 activates trigger circuitry 47 via the TRIGARM line. Trigger circuitry 47 monitors the waveform under test for a user-defined trigger event. When a trigger event occurs, the trigger circuitry 47 signals the timebase 51 via the SYSTRIG line. The timebase 51 begins decrementing the post-trigger delay counter for each sample acquired and stored in memory 43 after the trigger event. When the post-trigger counter reaches zero, the timebase 51 halts the acquisition. The points of interest as defined by the user reside in memory 43 and need to be transferred to the display.

The microprocessor 44 controls the timebase and the processing of the acquisition. In response to the acquisition processing, the microprocessor 44 activates bits in a display memory 45 which correspond to pixels on a display 46. Every time a point is plotted, the microprocessor 44 translates the x-axis and y-axis values of the point so that the corresponding bit in display memory 45 is activated.

FIB. 7A shows a timing diagram of several control lines used during sampling. FIG. 7B shows a logic diagram for the coarse interpolater counter. FIG. 7C shows a logic diagram for the fine interpolator counter.

Figure 7A:
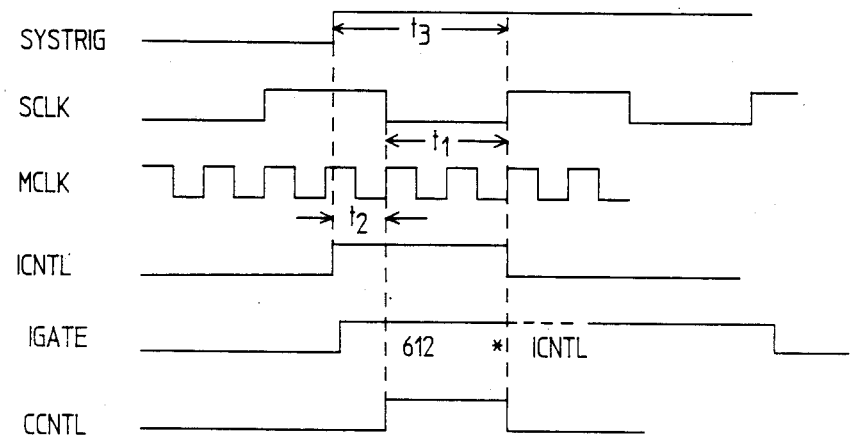
FIGS. 7A, 7B, and 7C show a timing diagram and some logic circuit diagrams for some timebase circuitry according to the preferred embodiment of the present invention.
Figure 7B:
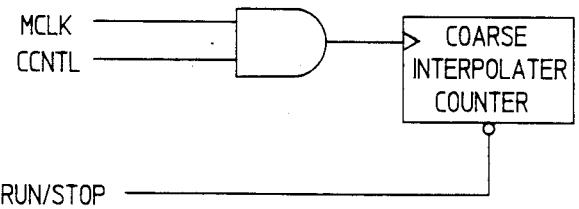
Figure 7C:
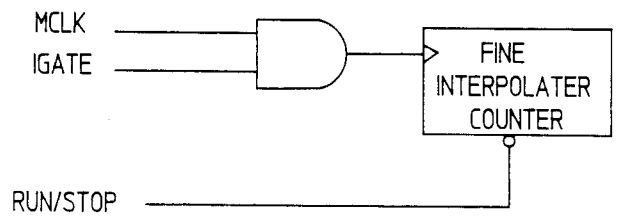
Figure 8:
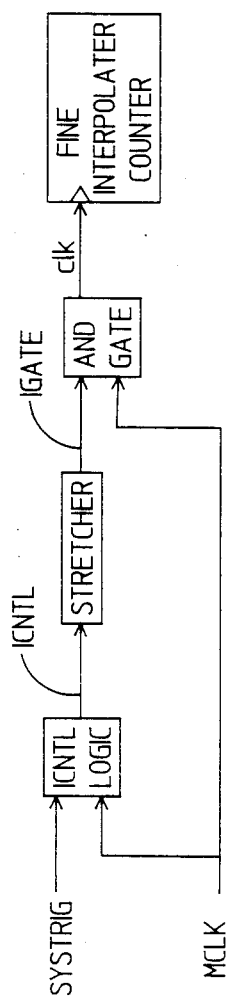
FIG. 8 shows a logic circuit diagram of a portion of the fine interpolator counter according to the preferred embodiment of the present invention.

FIG. 8 shows a logic diagram for the hardware associated with the timing diagram of FIG. 7A. This hardware is used with the fine interpolator counter in the timebase.

FIG. 11A shows a diagram of the burp counter used within the timebase 51 to step the memory 43 after an acquisition to get to the first valid point, according to the user definitions. FIG. 11B is a representation of the circular memory and the cycle used during acquisition and after acquisition.

Figures 9A, 9B:
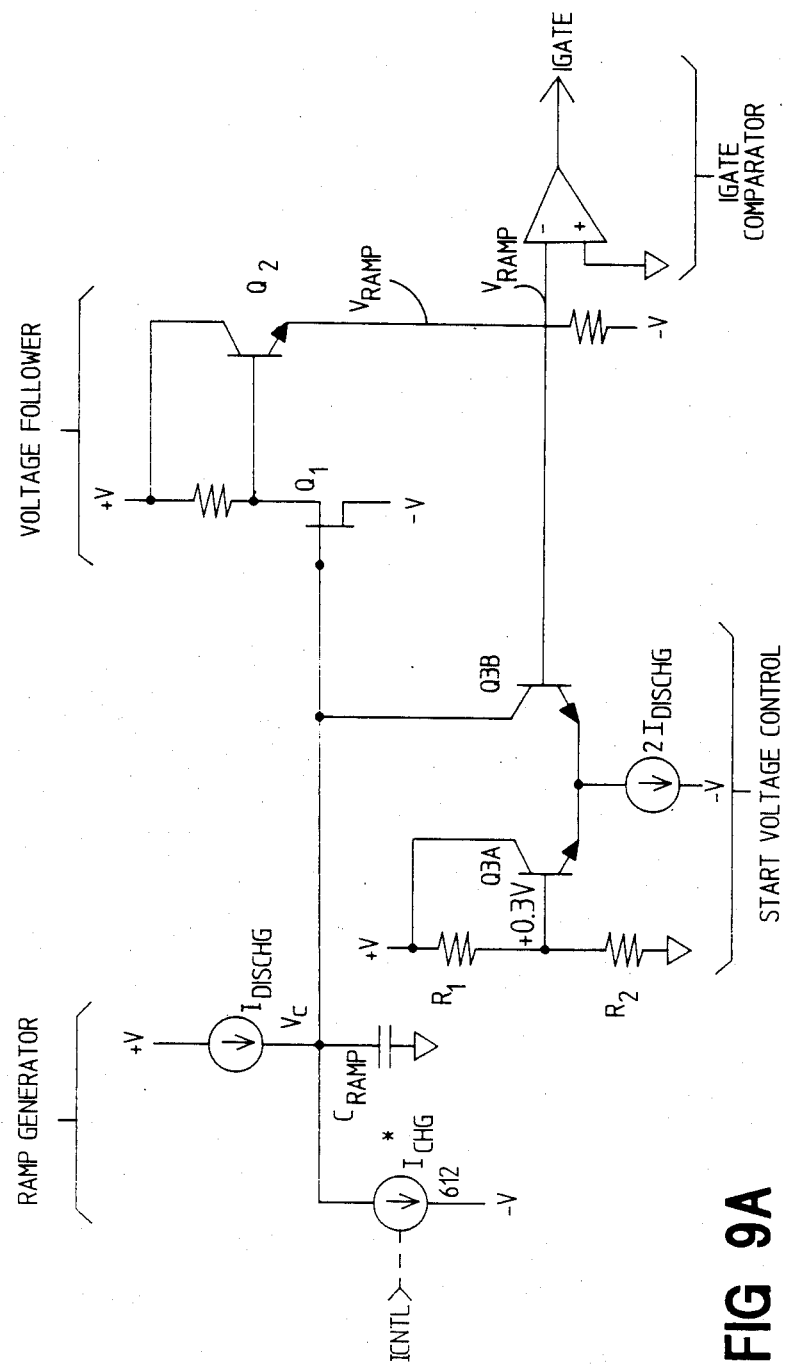
FIGS. 9a and 9b show a schematic of a stretcher circuit and a table used by the interpolator in the timebase circuit according to the preferred embodiment of the present invention.

The pulse stretcher hardware in FIG. 9A consists of five main functional blocks:

(1) Switchable Charge current source, Ichg. This will be used to generate a negative going ramp on the integrator capacitor only as long as ICNTL is true.

(2) Discharge current source, Idischg. Equals Ichg divided by the Stretch Ratio. This will cause a positive going ramp on the integrator capacitor after ICNTL returns false.

(3) Integrator capacitor, Cramp.

(4) Voltage follower. Consists of a JFET source follower (Q1) and a transistor emitter follower (Q2).

(5) Ramp start voltage stabilizer. Consists of a +0.3 V voltage source (R1 and R2) and a differential pair (Q3A and Q3B).

(6) Igate comparator.

Figure 10:
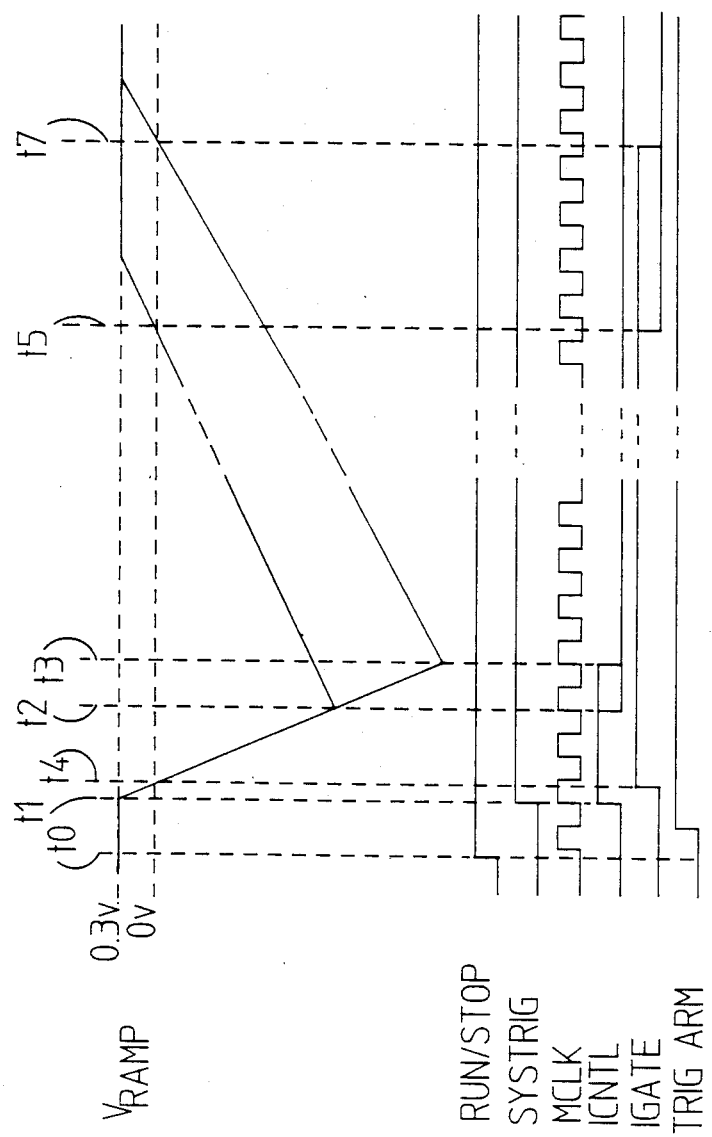
FIG. 10 shows a timing diagram for a stretcher circuit used by the interpolator in the timebase circuit according to the preferred embodiment of the present invention.
Figure 12:
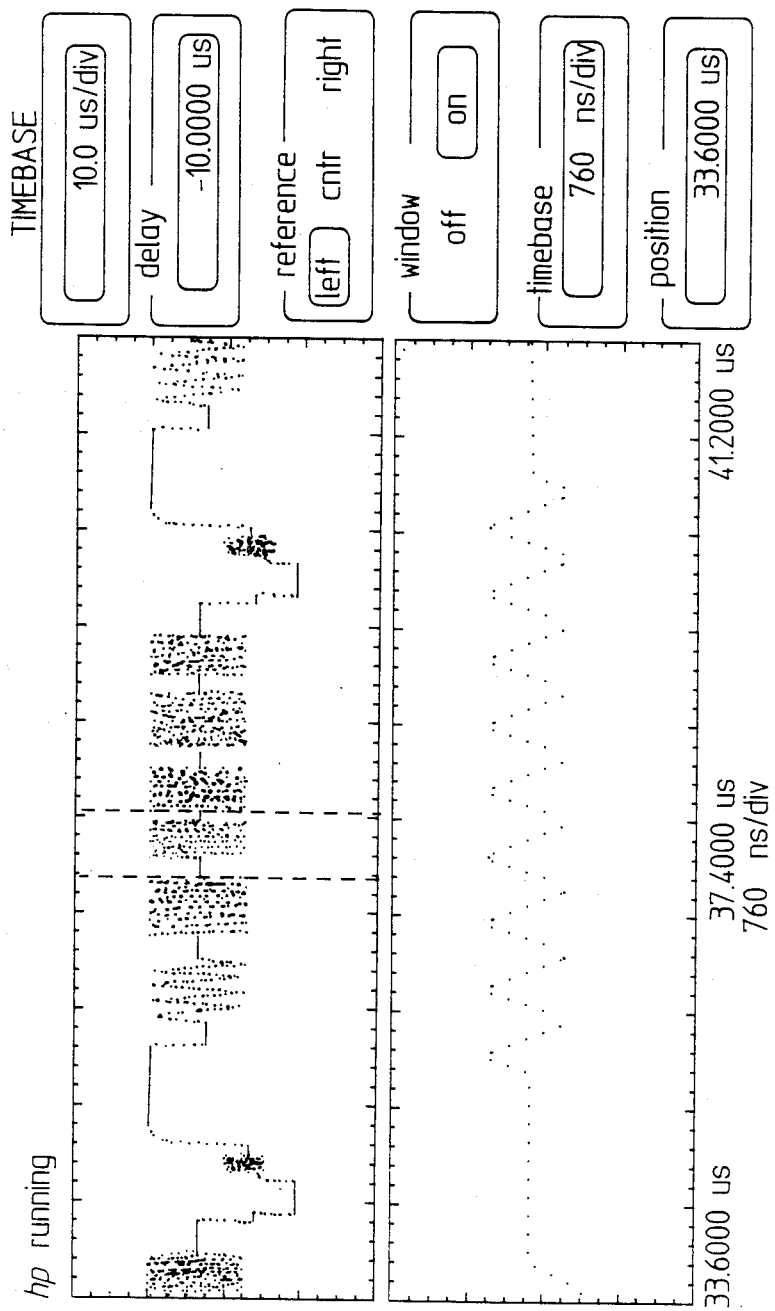
FIG. 12 shows an example of a display according to the preferred embodiment of the present invention.

A typical interpolation cycle is broken down into three different areas based on the state of the data acquisition cycle. To start an acquisition, RUN is set high and the sampling clock begins to clock in pretrigger samples as shown at time t0 in FIG. 10. Once this pretrigger data has been collected, the trigger hardware is ARMed to look for a trigger event as shown in FIG. 10. When a trigger is detected, SYSTRIG immediately goes true as shown at time t1 in FIG. 10. At this time ICNTL is applied and the stretcher hardware is used to stretch the time between SYSTRIG and the third rising edge of MCLK. The three operating modes of the stretch circuitry is as follows:

(1) Before ICNTL Applied (maintaining +0.3 V reference level on stretcher)

The circuit is static before an ICNTL pulse is applied. Vramp is held at +0.3 V by the Start Voltage Stabilizer differential pair, which sinks Idischg through Q3B.

(2) ICNTL Goes True (a trigger event has been recognized)

When ICNTL goes true, Ichg is drawn from Cramp whose voltage begins to fall at a rate of (Ichg-Idischg)/Cramp Volts/second. As soon as Vc (and therefore Vramp) begins to fall, Q3B turns off and no longer draws any current from Cramp. As Vramp falls through 0V, the comparator switches and IGATE goes true as shown at time t4 in FIG. 10. Vc (and Vramp) continue linearly in a negative direction as long as ICNTL is true.

(3) ICNTL Returns False (third rising edge of MCLK detected as shown at time t2 and t3 in FIG. 10. Time t2 shows the results when SYSTRIG occurs just prior to MCLK at time t1. Time t3 shows the results when SYSTRIG occurs just after MCLK at time t1. Both cases are given to show the parameters of the results.)

When ICNTL goes false, Ichg is switched off. Vc (and Vramp) begin to ramp in a positive direction at a rate of Idischg/Cramp Volts/second. When Vramp becomes greater than 0 V, the comparator switches and IGATE returns false. As the ramp continues in a positive direction, Q3B starts to turn back on and holds the ramp at +0.3 V in preparation for another interpolation cycle.

FIG. 10 shows the timing diagram of critical control lines and clocks used in the acquisition/interpolation cycle and how they relate to the 1:612 stretcher. The acquisition cycle is started by setting RUN true. Pretrigger samples are taken and stored in Ram and TRIG-ARM is set true setting the trigger circuitry in a state where it is looking for a trigger event. When the trigger event occurs, SYSTRIG goes high causing ICNTL to go high at time t1. Up until this trigger event, the stretch has been maintaining a +0.3 V level. As ICNTL goes high, the negative going ramp begins to discharge past the 0 V level. It is at time that IGATE goes true at time t2 or t3. ICNTL goes low again when the third rising MCLK edge following SYSTRIG occurs. Since ICNTL is being fed through the 1:612 dual slope converter, IGATE remains high 612 TIMES the pulse width of ICNTL. The actual time that IGATE goes low is when the positive going ramp of the stretch reaches the 0 V level. Since the pulse width of ICNTL can be two to three MCLK periods, the vertical lines marked time s t2 and t3 form a boundary of all intermediate pulse widths of ICNTL. The same is true for the pulse widths of IGATE at time t5 and t7 except that the pulse widths are 612 times the pulse widths of ICNTL. In FIG. 10 the MCLK edge was made to be coincident with SYSTRIG in order to more easily explain the min/max pulse widths of ICNTL. In a typical timing diagram, these two edges would not be coincident since it is the variability in time between SYSTRIG and the third rising edge of MCLK that allows the display to fill up even when less than a full record is acquired per acquisition.

In order to understand how timebase(1) and timebase(2) displays accumulate, we will need to review the process followed to plot both displays on screen. The equations that will be used in this example are as follows:

Static Variables record_size =
number of points displayed across screen = 500 buckets
sample_time =
50ns (rounding 20.4248365MHz to 20MHz, period = 1/20MHz)
FI_time = time of one fine interpolator = 20ps
time/div(1) = 100ns
time/div(2) = 10ns
delay(1) = 0.0ns
delay(2) = 0.0ns Other Variables screen_width(1) = time/div(1) * 10divs = 100ns/div * 10 = 1us
screen_width(2) = time/div(2) * 10divs = 10ns/div * 10 = 100ns
time_per_bkt = screen_width(1)/record_size = 1us/500 = 2ns
bkts_per_sclk = increment in buckets between two sample points
    = sample_time/time_per_bkt = 50ns/2ns = 25
screen_left(1) = delay(1) − (5divs * time/div(1)) = 0 − (5*100ns) = −500 ns
screen_right(1) = delay(1) + (5divs * time/div(1)) = 0 + (5*100ns) = 500ns
time_left_marker = delays(2) − (5 * time/div(2)) = 0 − (5 * 10ns) = −50ns
time_right_marker = delay(2) + (5 * time/div(2)) = 0 + (5 * 10ns) = 50ns
left_marker_bkt_index = position in 500 point record where left marker lies
    = (time_left_marker - screen_left(1))/time_per_bkt
    = (−50ns − −500ns)/2ns = 450ns/2ns = 225
right_marker_bkt_index = position in 500 point record where right marker lies
    = (time_right_marker - screen_left(1))/time_per_bkt
    = (50ns − −500ns)/2ns = 550ns/2ns = 275
FIs_per_bkt(1) = screen_width(1)/record_size/FI_time = 1us/500/20ps = 100
FIs_per_bkt(2) = screen_width(2)/record_size/FI_time = 100ns/500/20ps = 10
first_bkt_index = position where 1st unloaded point will be placed on screen.
    FI_count is the number of 20ps counts from trig to 1st
    sample clock. Several examples will be
    = FI_count/FIs_per_bkt(1)
bkt_index = first_bkt_index when unloading the first point and increments
    by bkts_per_sclk for subsequent unloaded points.
expansion_factor = screen_width(1)/creen_width(2)

Using the variable equations above, we can go through the steps needed to obtain both timebase(1) and timebase(2) displays. The data points for both timebases in the HP54503 are stored in two separate data arrays. Each array has a record_size of 500 time buckets which corresponds to the 500 data points plotted on screen for both screens. The time_per_bkt for timebase(1) is 2ns and for timebase(2), 200ps. The time_left_marker equals −50ns and the time_right_marker equals 50ns.

These two marker positions correspond to a left_marker_bkt_index of 225 and a right_marker_bkt_index of 275. The final variable, bkts_per_sclk equals 25 which means that sequential points in the timebase(1) upper plane will be plotted every 25 buckets.

Now that the values for our example have been calculated, the acquisition cycle can begin. First the timebase hardware is programmed. This involves setting up both the sample clock and the 80 MHz EXTERNAL interpolator clock. In our example, the sample clock has a period of 50 ns and with the 612 stretcher the resolution of the Fine Interpolator (FI) is 20 ps. Also programmed are the pretrigger and post trigger counters. Finally, the main timebase is programmed to RUN. This starts the pretrigger delay counters counting down. When they reach 0, the trigger is armed. When the trigger event is detected the Fine Interpolator counter begins counting the number of 20 ps increments between the trigger and the first rising edge of the sample clock. The post trigger counters also begin counting down once the trigger is detected. When they count down to 0 the acquisition has completed and all sampled points are available for reading from the acquisition Ram. The timebase is stopped and the Fine Interpolator Count(FIC) can be read from the timebase. This count will allow us to calculate the variable first_bkt_index which will be the time location where the first points is placed on screen.

Since the FIC represents the time from the trigger to the first sample clock, we can use this count to solve for the variable first_bkt_index. This value represents the timebase(1) buffer location where the first point will be stored. The variable bkt_index is also set to the value first_bkt_index. Once we have calculated this first_bkt_index, we can unload the first sample point from acquisition Ram, store it in the timebase(1) buffer and plot the sample point on screen in the upper plane. We then check to see if we are in dual timebase mode i.e. is window "on"? If it is on, we check to see if the calculated bucket index is within the marker domain. If it is we then calculate where the point will lie in the timebase(2) buffer, store it in the buffer at that index and plot the expanded point on the lower windowed plane. From here we add bkts_per_sclk to the current bucket_index which sets us up to unload and plot the next acquired point. Then we check to see if we have unloaded all points for the current acquisition cycle. If not we return to unload, store and plot the next timebase(1) point and if it lies between the markers, we expand it to the lower plane. Those points that do not fall within the markers are stored only in the timebase(1) buffer then plotted. Only those points between the markers are expanded and stored in the timebase(2) buffer. Once we have unloaded all points of timebase(1) (screen_width(1)/sample_time=1 us/50 ns=20) and timebase(2) (screen_width(2)/sample_time=100 ns/50 ns=2), we then start all over again to collect subsequent acquisition sweeps. Since timebase(1) and timebase(2) acquire 20 and 2 points per sweep respectively, it would take a minimum of 25 sweeps (500 bkts/20) to fill the upper screen and 250 sweeps (500 bkts/2) to fill the lower screen. This assumes that the FI_count values read at each pass uniquely place points in buckets that have not been hit on previous passes.

The accumulation of both the upper and lower display becomes more apparent when we examine an example of how data gets place in three separate acquisition cycles. During Pass 1, we read an FI_count value of 100. To calculate the timebase(1) first_bkt_index we use the formula:

$$\text{first\_bkt\_index} = \text{FI\_count}/\text{FIs\_per\_bkt} \quad (1)$$

This results in 100/100=1 so the first_bkt_index=bkt_index=1 and the first sample point is stored in the 1st buffer location. Since this point does not lie between the window markers we increment the bkt_index by bkts_per_sclk (25) and unload subsequent sample points until we have incremented to the 226th timebase(1) buffer location. By this time, the timebase(1) buffer has 8 points in it at locations 1, 26, 51, 76, 101, 126, 151, 176, and 201. Now we unload the 226th timebase(1) point, store it and plot it. Since this is the first point that lies between the markers we need to calculate the window_index.

$$\text{window\_index} = ((\text{bkt\_index} - \text{left\_marker\_index}) * \text{expansion\_factor}))$$

Using the equation above, window_index equals (226-225)* 10=10. Therefore, the first expanded point is stored in timebase(2) buffer index 10 and is plotted in the lower plane at location 10. The bkt_index is then incremented by bkts_per_sclk(25) to the 251st bkt location of timebase(1). The next data point is read from Ram and stored and plotted in the 251st timebase(1) buffer location. The corresponding timebase(2) expanded point is stored in the 260th location of the timebase(2) location since window_index now equals (251−225) * 10=260. The bkt_index is again incremented by bkts_per_sclk(25) which brings us to the 276th location in the timebase(1) display. The next point is unloaded from Ram and the point resolves to the 276th location of the timebase(1) buffer which is now to the right of the window markers. We continue to add bkts_per_sclk to bkt_index and timebase(1) buffer locations 301, 326, 351, 376, 401, 426, 451 and 476 are unloaded from Ram, stored in the timebase(1) buffer and plotted on screen at the corresponding locations. By the end of the first pass we have unloaded 20 timebase(1) points and 2 timebase(2) points.

The second pass reads an interpolator value of 400 which resolves to a first_bkt_index=bkt_index=400/100=4. Nine points are unloaded before we reach the left_marker_index. These points resolve to locations 4, 29, 54, 79, 104, 129 154, 179. and 204 of timebase(1) buffer. The next bkt_index is 229 which is between the markers. The next point is unloaded from Ram and stored and plotted at location 229. The corresponding window_index results in a timebase(2) buffer location placement of 40((229−225) * 10). The bkt_index is again incremented by bkts_per_sclk(25) and the next timebase(1) point resolves to location 254 and timebase(2) point resolves to location 290 ((254−225) * 10). The bkt_index is again incremented by bkts_per_sclk which brings us to location 279 which is outside of the markers. The final unloaded timebase(1) points are stored and plotted at locations 279, 304, 329, 354, 379, 404, 429, 454 and 479. At the end of Pass 2, timebase(1) buffer contains 40 points and timebase(2) contains 4 points.

Pass three reads an interpolator count of 700 resulting in a first_bkt_index=bkt_index=700/100=7. Following the same calculations as used for Pass 1 and Pass 2 we get 20 new points in timebase(1) locations, 7, 32, 57, 82, 107, 132, 157, 182, 207, 232, 257, 282, 307, 332,

357, 382, 407, 432, 457 and 482. Timebase(2) points resolve to location 70 ((232−225) * 10) and location 320 (257−225) * 10).

I claim:

1. A method of concurrently displaying a repetitive waveform under test on a first display at a first resolution and user-defined subsection of the waveform under test at a second resolution higher than the first resolution on a second display, comprising the steps of:

initializing hardware;

determining the display left edge residual time and the high resolution column increment from the user-defined information and the sample time;

making an acquisition of a set of points relative to a trigger event and storing the set in a memory;

calculating a high resolution column index from the residual time and the interpolater time and the high resolution column increment for each point to be displayed on the first display;

truncating a value equal to the high resolution column index to determine the appropriate column value for each point to be displayed;

plotting each point to the first display according to the column value for the time axis and the value stored in memory for the y-axis;

testing each point to determine if it lies within a user-defined subsection of first display;

subtracting the left subsection marker value from the high resolution column index to obtain a second display column value for each point within the user-defined subsection of the first display;

multiplying the second display column value by the expansion ratio of the first display to the second display for each point within the user-defined subsection of the first display;

converting the second display column value to a column measurement and truncating it to determine the appropriate second display column;

plotting each point within the user-defined subsection of the first display to the second display according to the second display column value for the time axis and the value stored in memory for the y-axis;

repeating the acquisition step and succeeding steps until halted by a user command.

2. An apparatus for concurrently displaying a repetitive waveform under test on a first display at a first resolution and a user-defined subsection of the waveform under test at a second resolution higher than the first resolution on a second display, comprising:

sampler means for continuously sampling and holding the analog value of the waveform under test upon user command;

converter means for converting each sampled signal from the analog value to a digital value;

first memory means for continuously holding the last N sampled signal where N is the number of location within the first memory means;

sample clock means for clocking the sampler means and the converter means;

processor means for converting digital signals from the first memory means into display signals for a first display having a first resolution and for a second user-determined display having a second resolution higher than the first resolution;

display memory means for holding display signals;

display means for displaying signal according to display signals in the display memory; and timebase means connected to the processor means and the sample clock means for controlling the sampling, converting, and storing of samples, and for measuring the time between a user-defined trigger event and the next sample clock pulse.

* * * * *